(12) United States Patent
Ieda et al.

(10) Patent No.: US 9,395,421 B2
(45) Date of Patent: Jul. 19, 2016

(54) CIRCUIT FAULT DETECTION DEVICE

(71) Applicants: Masataka Ieda, Tokyo (JP); Shuya Sano, Tokyo (JP); Masaaki Ono, Tokyo (JP)

(72) Inventors: Masataka Ieda, Tokyo (JP); Shuya Sano, Tokyo (JP); Masaaki Ono, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/650,912

(22) PCT Filed: Dec. 12, 2012

(86) PCT No.: PCT/JP2012/082229
§ 371 (c)(1),
(2) Date: Jun. 10, 2015

(87) PCT Pub. No.: WO2014/091581
PCT Pub. Date: Jun. 19, 2014

(65) Prior Publication Data
US 2015/0316621 A1     Nov. 5, 2015

(51) Int. Cl.
*G01R 31/40*     (2014.01)
*H02H 7/122*     (2006.01)

(52) U.S. Cl.
CPC ............. *G01R 31/40* (2013.01); *H02H 7/122* (2013.01); *H02H 7/1227* (2013.01)

(58) Field of Classification Search
CPC ....... G01R 31/40; G01R 33/44; G01R 33/441
See application file for complete search history.

(56) References Cited

U.S. PATENT DOCUMENTS

| | | | |
|---|---|---|---|
| 2006/0055365 A1* | 3/2006 | Kifuku | H02P 27/08 318/806 |
| 2006/0250121 A1* | 11/2006 | Tzeng | H02M 3/1563 323/288 |
| 2010/0057476 A1* | 3/2010 | Sudo | G10L 21/038 704/500 |
| 2010/0327667 A1 | 12/2010 | Fujita et al. | |
| 2011/0215751 A1 | 9/2011 | Sato | |

(Continued)

FOREIGN PATENT DOCUMENTS

| CN | 102170265 A | 8/2011 |
|---|---|---|
| JP | 62-297765 A | 12/1987 |

(Continued)

OTHER PUBLICATIONS

Taiwanese Office Action for TW 102120677 dated Nov. 4, 2014, English Translation.

(Continued)

*Primary Examiner* — Huy Q Phan
*Assistant Examiner* — Alvaro Fortich
(74) *Attorney, Agent, or Firm* — Sughrue Mion, PLLC (57) ABSTRACT

A circuit fault detection device includes: an interruption-signal generation unit that outputs an interruption signal for a drive circuit stopping driving of a drive target on a basis of the interruption signal; a pulse generation unit that includes an adjustment unit adjusting a time during which a pulse signal is in an OFF state and that generates the pulse signal; a signal synthesis unit that outputs a logical AND of the interruption signal and the pulse signal; a filter circuit that inputs, as an output, a signal obtained by delaying an output signal of the signal synthesis unit to the drive circuit; and a monitoring unit that determines whether a circuit fault has occurred on a basis of an output voltage of the filter circuit.

6 Claims, 9 Drawing Sheets

(56) References Cited

U.S. PATENT DOCUMENTS

| | | |
|---|---|---|
| 2011/0221377 A1 | 9/2011 | Ueno |
| 2011/0241447 A1 | 10/2011 | Ando et al. |
| 2012/0146567 A1 | 6/2012 | Iwaji et al. |

FOREIGN PATENT DOCUMENTS

| | | |
|---|---|---|
| JP | 3-96871 A | 4/1991 |
| JP | 4-94837 U | 8/1992 |
| JP | 5-80076 A | 3/1993 |
| JP | 8-47296 A | 2/1996 |
| JP | 2005-44074 A | 2/2005 |
| JP | 2011-8642 A | 1/2011 |
| JP | 2011-182535 A | 9/2011 |
| JP | 2011-192015 A | 9/2011 |
| JP | 2011-229359 A | 11/2011 |
| JP | 2012-242338 A | 12/2012 |
| WO | 2011/135623 A1 | 11/2011 |

OTHER PUBLICATIONS

International Search Report for PCT/JP2012/082229 dated Jun. 11, 2013, English Translation.

* cited by examiner

CIRCUIT FAULT DETECTION DEVICE

CROSS REFERENCE TO RELATED APPLICATIONS

This application is a National Stage of International Application No. PCT/JP2012/082229 filed Dec. 12, 2012, the contents of which are incorporated herein by reference in their entirety.

FIELD

The present invention relates to a circuit fault detection device that detects a fault in a circuit transmitting a power-supply interruption signal.

BACKGROUND

In recent years, with the widespread use of electrical devices such as a motor, the likelihood that a faulty operation of an electrical device leads to a major accident has become increasingly large and thus minimization of the risk of accidents has been demanded. International Standards are defined in order to keep the risk within an allowable range. IEC61508 is defined as a standard related to electrical devices and IEC61800-5-2 is defined as a standard for drive devices such as a motor.

IEC61800-5-2 specifies a Safe Torque Off function (STO) as a safety function. In the Safe Torque Off function, the motor power is interrupted when an interruption command is received from outside. Not only for motors but for any devices, it is an important function for safety that the power can be definitely interrupted when required. To realize this function, it is necessary to periodically diagnose whether there is no fault such as disconnection or short-circuit in a circuit that transmits an interruption signal.

CITATION LIST

Patent Literature

Patent Literature 1: Japanese Patent Application Laid-open No. 2011-182535

SUMMARY

Technical Problem

To securely achieve interruption of a power supply, whether there is no fault such as disconnection or short-circuit in a circuit is periodically diagnosed. As a method for the diagnosis, a method of temporarily inputting a pulsed interruption signal (a test pulse) and checking, with feedback, whether the signal is definitely transmitted is conceivable. However, this method actually interrupts the motor power.

In Patent Literature 1, power supply interruption with a test pulse is avoided by delaying an interruption signal using a delay circuit. However, because a signal before reaching the delay circuit is fed back and observed, there is a problem that the diagnosis range is limited. Specifically, a failure of the delay circuit cannot be detected.

Meanwhile, the OFF time of the test pulse may exceed the delay time of the delay circuit when it is too long and observation of a feedback signal becomes difficult when the OFF time is too short. Accordingly, the OFF time needs to be set appropriately. Particularly, when the delay circuit is configured from a RC filter, the delay time changes according to the value of current that flows in the signal. That is, the delay time changes according to the load connected to the delay signal. When the load varies or is unknown, the OFF time of the test pulse cannot be determined in advance.

The present invention has been achieved in view of the above problems, and an object of the present invention is to provide a circuit fault detection device that is capable of detecting a fault in an interruption circuit in a wide range including also the delay circuit described above by using a test pulse without stopping an operation of a motor and achieving a diagnosis even when a load varies or is unknown.

Solution to Problem

In order to solve the above problems and achieve the object, the present invention relates to a circuit fault detection device including: an interruption-signal generation unit that outputs an interruption signal for a drive circuit stopping driving of a drive target on a basis of the interruption signal; a pulse generation unit that includes an adjustment unit adjusting a time during which a pulse signal is in an OFF state and that generates the pulse signal; a signal synthesis unit that outputs a logical AND of the interruption signal and the pulse signal; a filter circuit that inputs, as an output, a signal obtained by delaying an output signal of the signal synthesis unit to the drive circuit; and a monitoring unit that determines whether a circuit fault has occurred on a basis of an output voltage of the filter circuit.

Advantageous Effects of Invention

The circuit fault detection device according to the present invention can detect a fault in a power-supply interruption circuit in a wide range including also a filter circuit without stopping the operation of a motor. Furthermore, an effect is obtained where a circuit diagnosis can be achieved also in a case where a load connected to an interruption signal varies or is unknown.

DESCRIPTION OF EMBODIMENTS

Exemplary embodiments of a circuit fault detection device according to the present invention will be explained below in detail with reference to the accompanying drawings. The present invention is not limited to the embodiments.

First Embodiment

Figure 1:
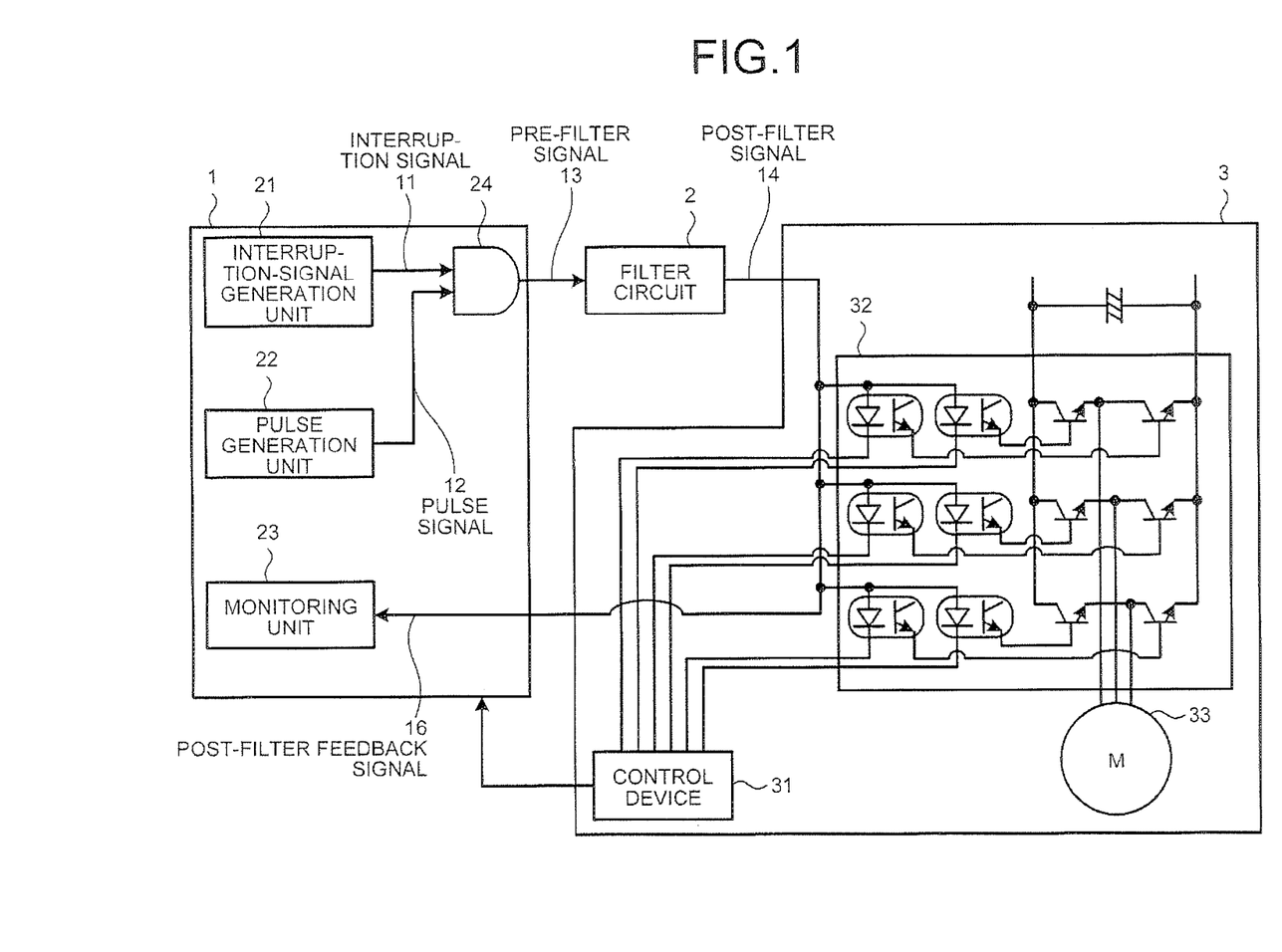
FIG. 1 is a configuration diagram of a circuit fault detection device and a motor drive device according to a first embodiment of the present invention.
Figure 2:
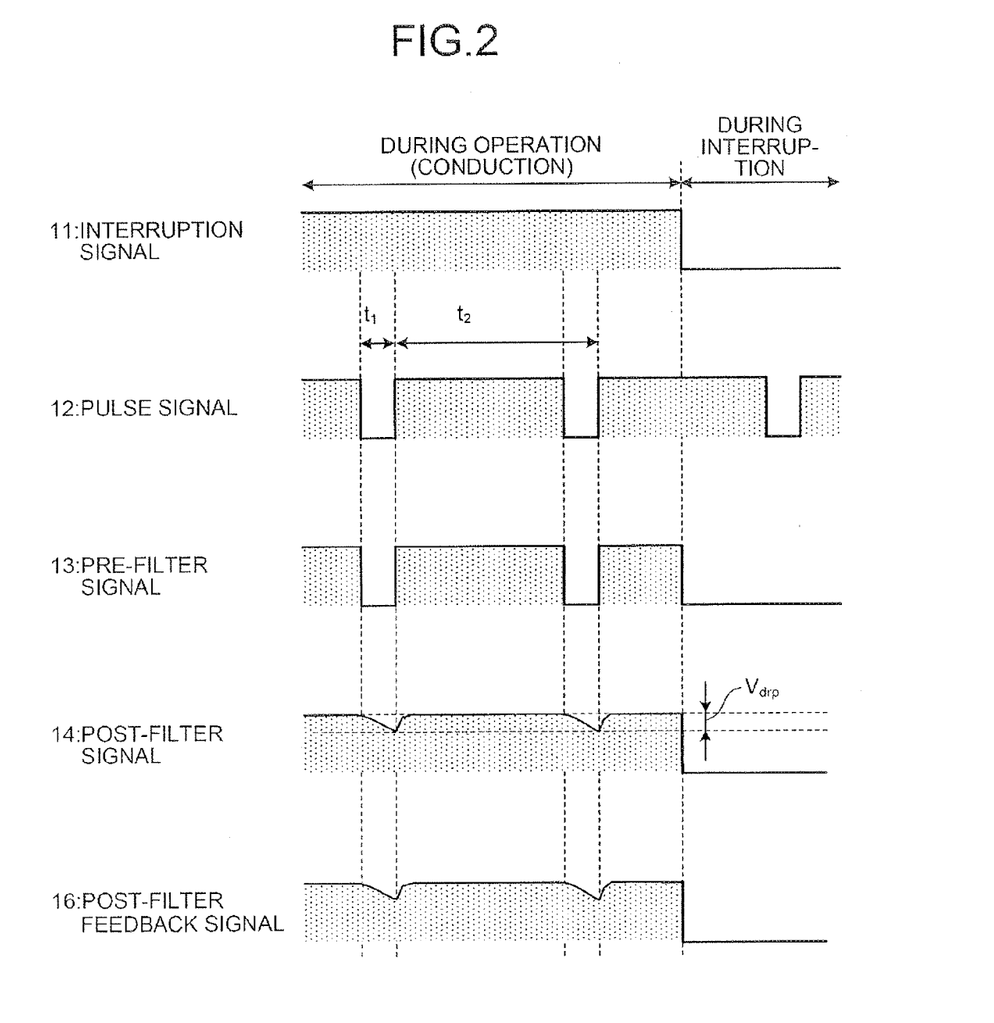
FIG. 2 is a timing chart for explaining an operation of signals in the circuit fault detection device and the motor drive device according to the first embodiment of the present invention.

FIG. 1 is a configuration diagram of a circuit fault detection device and a motor drive device according to a first embodiment of the present invention. The circuit fault detection device includes a computing device 1 and a filter circuit 2. The motor drive circuit is a load 3. FIG. 2 is a timing chart showing an operation of signals in the circuit fault detection device and the motor drive device according to the present embodiment. The computing device 1 in FIG. 1 is, for example, a microcomputer and includes an interruption-signal generation unit 21, a pulse generation unit 22, a monitoring unit 23, and a signal synthesis unit 24. While configured as programs realized on one microcomputer in the present embodiment, the interruption-signal generation unit 21, the pulse generation unit 22, the monitoring unit 23, and the signal synthesis unit 24 can be configured on different microcomputers, respectively, or can be configured from electrical circuits.

The interruption-signal generation unit 21 outputs an interruption signal 11 according to an input (not shown) from outside. The interruption signal 11 is ON during the operation of the motor drive device and the interruption signal 11 is turned OFF when the power of an electrical device of the motor drive device is to be interrupted.

The pulse generation unit 22 outputs a pulse signal 12 that is a test pulse. The pulse signal 12 is normally ON and is periodically turned OFF in pulses, as shown in FIG. 2. An OFF pulse time t1 can be fixed or variable. A method of determining the OFF pulse time t1 is explained later.

The signal synthesis unit 24 performs an AND operation on the interruption signal 11 and the pulse signal 12 to output a pre-filter signal 13. The pre-filter signal 13 is a signal that is obtained by superimposing a pulse on the interruption signal 11 periodically when the interruption signal 11 is ON and that becomes OFF with no pulse superimposed when the interruption signal 11 is OFF, as shown in FIG. 2.

The filter circuit 2 delays the pre-filter signal 13 and outputs a post-filter signal 14. The filter circuit 2 is normally a low-pass filter configured from an RC. However, other circuits can be used instead as long as they are filters having a property of delaying a signal. The post-filter signal 14 is connected to the load 3. When the post-filter signal 14 is turned OFF, the load 3 is interrupted. The post-filter signal 14 has a certain amount of voltage drop Vdrp during pulse outputting. The post-filter signal 14 is fed back from the load 3 and is input as a post-filter feedback signal 16 to the monitoring unit 23.

The load 3 is explained in more detail. In the present embodiment, the motor drive device is shown as an example of the load 3. A control device 31 outputs six pulse-width modulation (PWM) signals. The six PWM signals are input to a bridge circuit 32 (a motor drive circuit) and the bridge circuit 32 converts the PWM signals to AC voltages for driving a motor 33 being a drive target. The bridge circuit 32 is configured not to operate when the post-filter signal 14 is OFF, and power is thus removed from the motor 33. As for a method by which the control device 31 outputs the PWM signals and a method by which the motor is driven on the basis of the PWM signals, existing techniques are used.

As long as the load 3 has only a function of receiving the post-filter signal 14 as an input and outputting the signal as it is as the post-filter feedback signal 16, the load 3 can have any form. Furthermore, a form in which the filter circuit 2 is included in the load 3 can be alternatively used, that is, the filter circuit 2 can be a part of the motor drive device.

Figure 3:
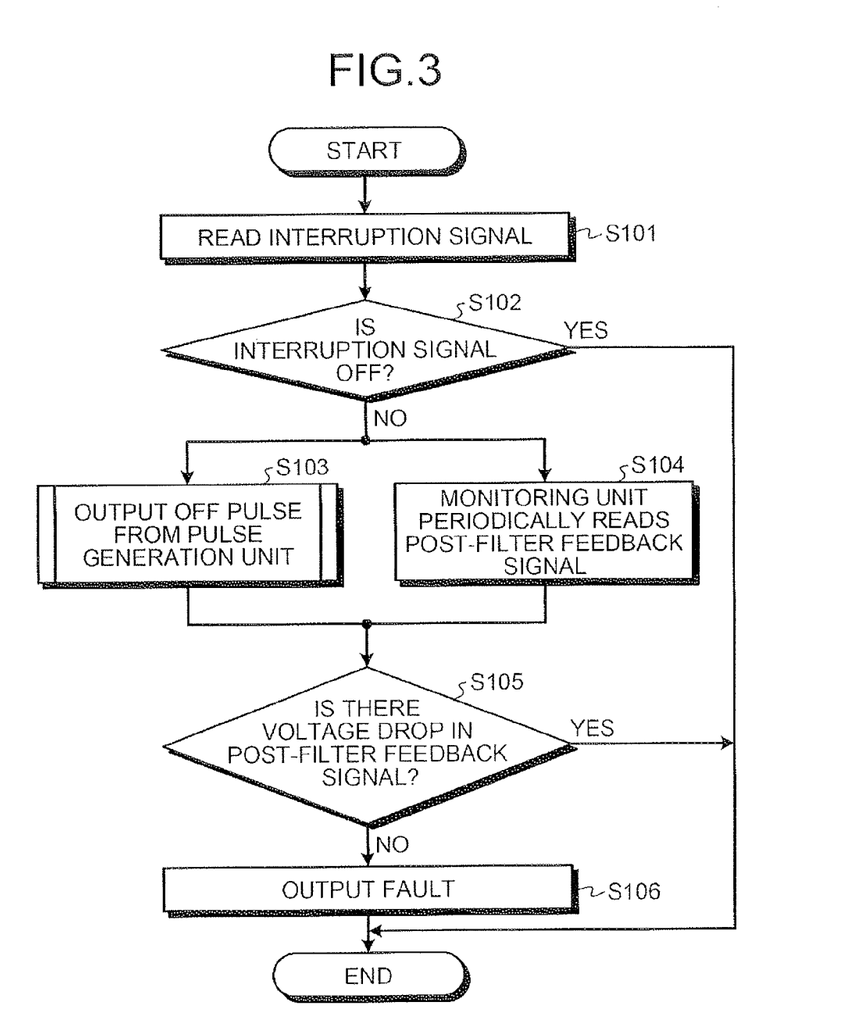
FIG. 3 is a flowchart for explaining an operation of the circuit fault detection device according to the first embodiment of the present invention.

Operations of the monitoring unit 23 and the pulse generation unit 22 are explained. The monitoring unit 23 checks that the post-filter feedback signal 16 is normal. FIG. 3 is a flowchart of processing of the monitoring unit 23 and the pulse generation unit 22 in the computing device 1 for explaining an operation of the circuit fault detection device according to the present embodiment. The computing device 1 performs the processing shown in the flowchart of FIG. 3 at a constant period. First, the computing device 1 reads the interruption signal 11 (Step S101). When the interruption signal 11 is OFF (YES at Step S102), the processing ends. When the interruption signal 11 is ON (NO at Step S102), an OFF pulse is output from the pulse generation unit 22 (Step S103), and the monitoring unit 23 periodically reads the post-filter feedback signal 16 (Step S104) and records therein the value. A method of outputting the OFF pulse from the pulse generation unit 22 (Step S103) is explained in detail later.

After outputting of the OFF pulse from the pulse generation unit 22 (Step S103) is completed, the monitoring unit 23 determines the value of the read post-filter feedback signal 16. When a voltage decline (a voltage drop) is observed (YES at Step S105), the operation is normal and thus the computing device 1 completes the processing without performing any process. When no voltage decline is observed (NO at Step S105), the computing device 1 determines that a circuit fault has occurred and outputs a fault (Step S106).

Processing of the pulse generation unit 22 to output the OFF pulse as the pulse signal 12 (Step S103) is explained next. As described above, in order for the monitoring unit 23 to observe the amount of voltage drop Vdrp in the post-filter feedback signal 16 occurring during outputting of the OFF pulse from the pulse generation unit 22, how to determine a width t1 of the OFF pulse is important. For the processing performed by the pulse generation unit 22 to output the OFF pulse as the pulse signal 12 (Step S103), any one of pulse output methods A, B, and C explained later can be used or other output methods can be used alternatively.

Figure 4:
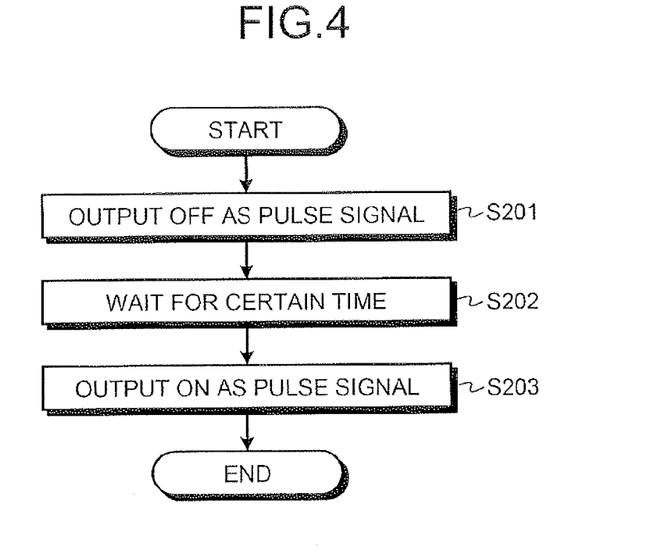
FIG. 4 is a flowchart for explaining an operation of a pulse output method A in the embodiment of the present invention.

The pulse output method A is a method of previously determining the width t1 of the OFF pulse. FIG. 4 is a flowchart of processing by the pulse output method A. When the processing is started, OFF is output as the pulse signal 12 (Step S201). Next, the pulse signal 12 waits for a certain time t1 with the OFF state maintained (Step S202). The waiting time t1 is appropriately set in advance according to the characteristics of the filter circuit 2 and the load 3. When the waiting time t1 has elapsed, ON is output as the pulse signal 12 (Step S203).

Figure 5:
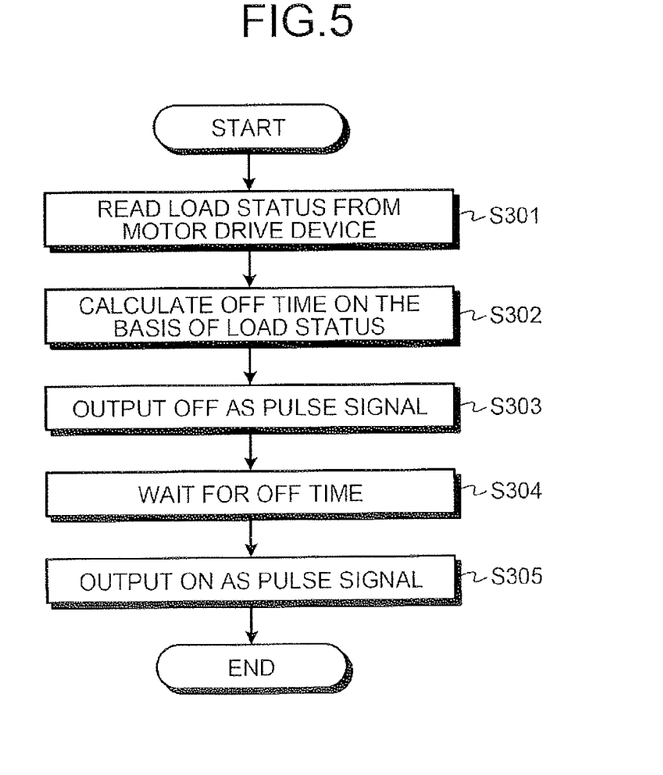
FIG. 5 is a flowchart for explaining an operation of a pulse output method B in the embodiment of the present invention.

The pulse output method B is a method of adjusting the OFF pulse width according to the status of the load 3. FIG. 5 is a flowchart of processing by the pulse output method B. When the processing is started, a current load status is read from the load 3 (the motor drive device) (Step S301). In the present embodiment, because the amount of current flowing in the post-filter signal 14 is defined by the status of the PWM signals output from the control device 31, the control device 31 notifies the computing device 1 of the load status (the status of the PWM signals output by the control device 31). Although a communication line with which the control device 31 notifies the computing device 1 of the load status is not shown, the communication line with which the control device 31 notifies the computing device 1 of the load status is required when the pulse output method B is used.

Next, the computing device 1 calculates the OFF time on the basis of the read load status (Step S302). In the bridge circuit 32 according to the present embodiment, when the OFF time of the six PWM signals output from the control device 31 is longer, the amount of current flowing in the post-filter signal 14 becomes larger and thus the amount of voltage drop Vdrp of the post-filter signal 14 is increased. Therefore, the OFF pulse width is reduced. In contrast, when the OFF time of the six PWM signals output from the control device 31 is short, the OFF pulse time is increased. Next, OFF is output as the pulse signal 12 (Step S303) and the pulse signal 12 waits for the OFF time that is previously calculated (Step S304). Then, ON is output as the pulse signal 12 (Step S305).

Figure 6:
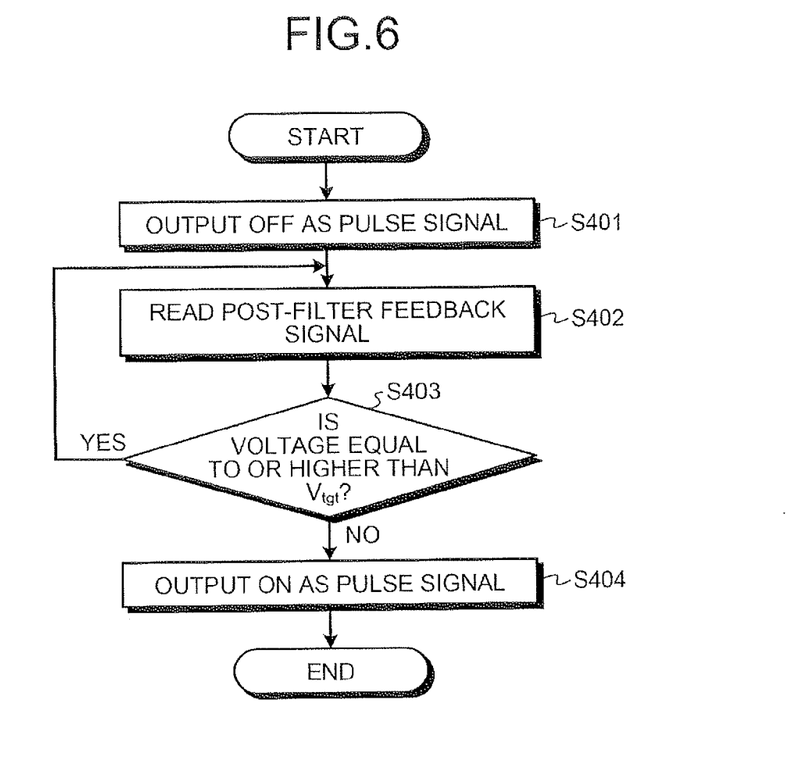
FIG. 6 is a flowchart for explaining an operation of a pulse output method C in the embodiment of the present invention.
Figure 7:
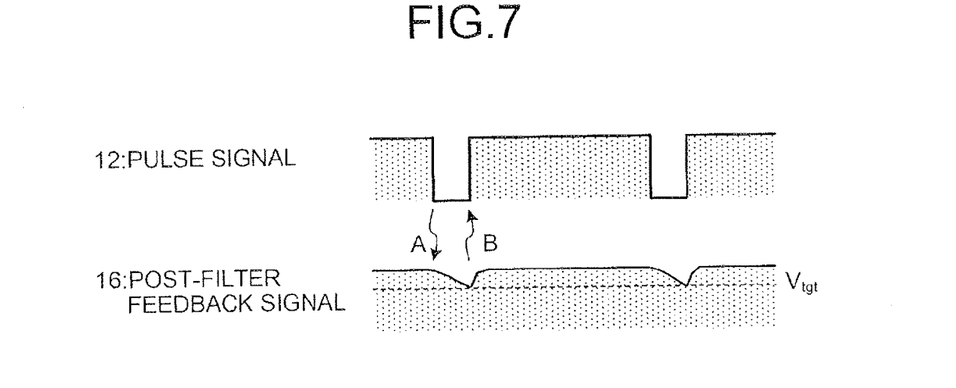
FIG. 7 is a timing chart for explaining an operation of the pulse output method C in the embodiment of the present invention.

The pulse output method C is a method of feedback-controlling the pulse signal 12 by referring to the post-filter feedback signal 16. FIG. 6 is a flowchart of processing by the pulse output method C. FIG. 7 shows an operation of each signal according to the pulse output method C. When the processing is started, OFF is output as the pulse signal 12 (Step S401). The voltage of the post-filter feedback signal 16 then starts dropping (A in FIG. 7). Next, the post-filter feedback signal 16 is read (Step S402). When the voltage of the read post-filter feedback signal 16 is equal to or higher than Vtgt (YES at Step S403), the post-filter feedback signal 16 is read again (Step S402). When the voltage of the read post-filter feedback signal 16 is not equal to or higher than Vtgt (NO at Step S403), that is, when the voltage of the post-filter feedback signal 16 falls below Vtgt, ON is output as the pulse signal 12 (Step S404) (B in FIG. 7).

Second Embodiment

Figure 8:
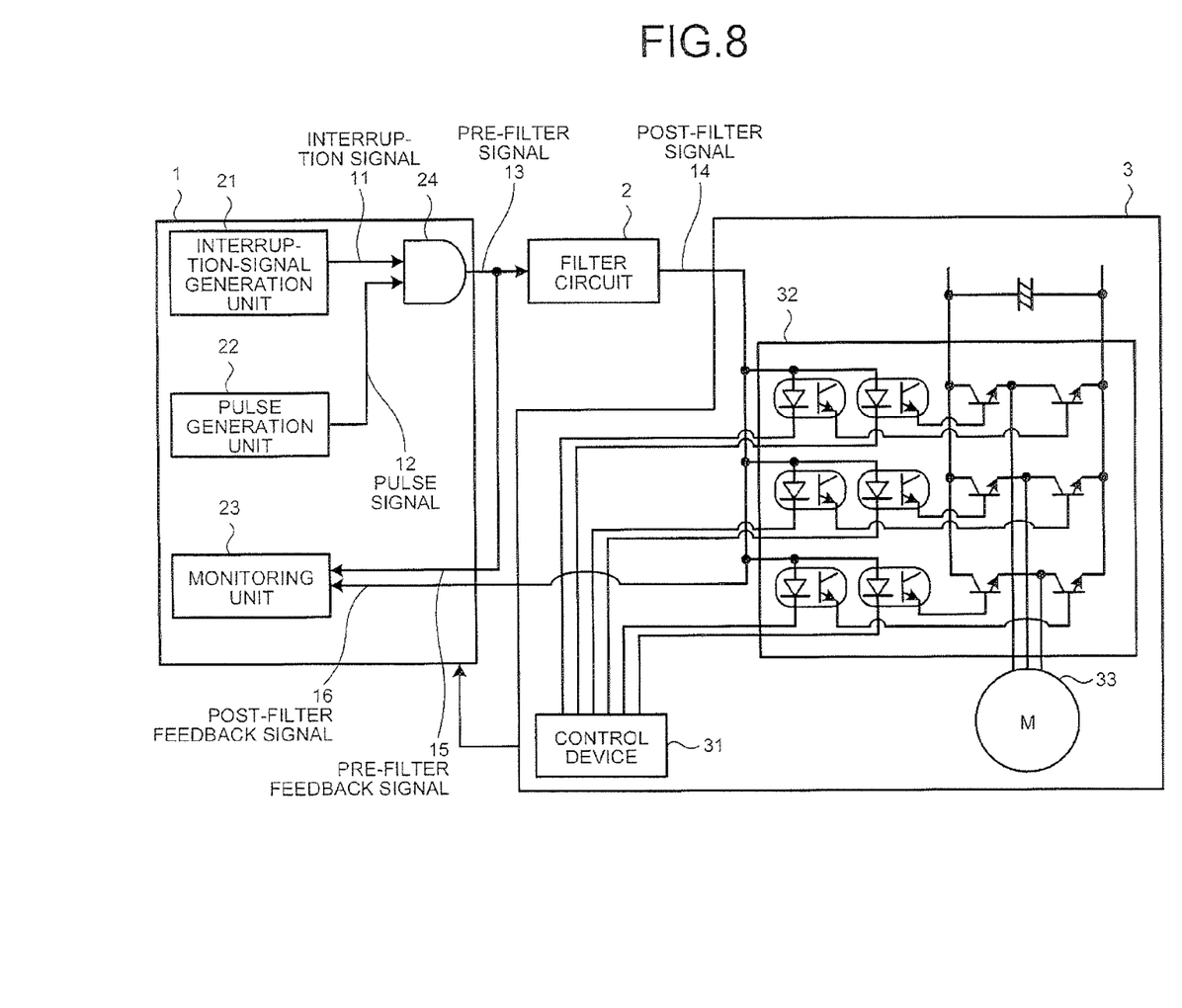
FIG. 8 is a configuration diagram of a circuit fault detection device and a motor drive device according to a second embodiment of the present invention.
Figure 9:
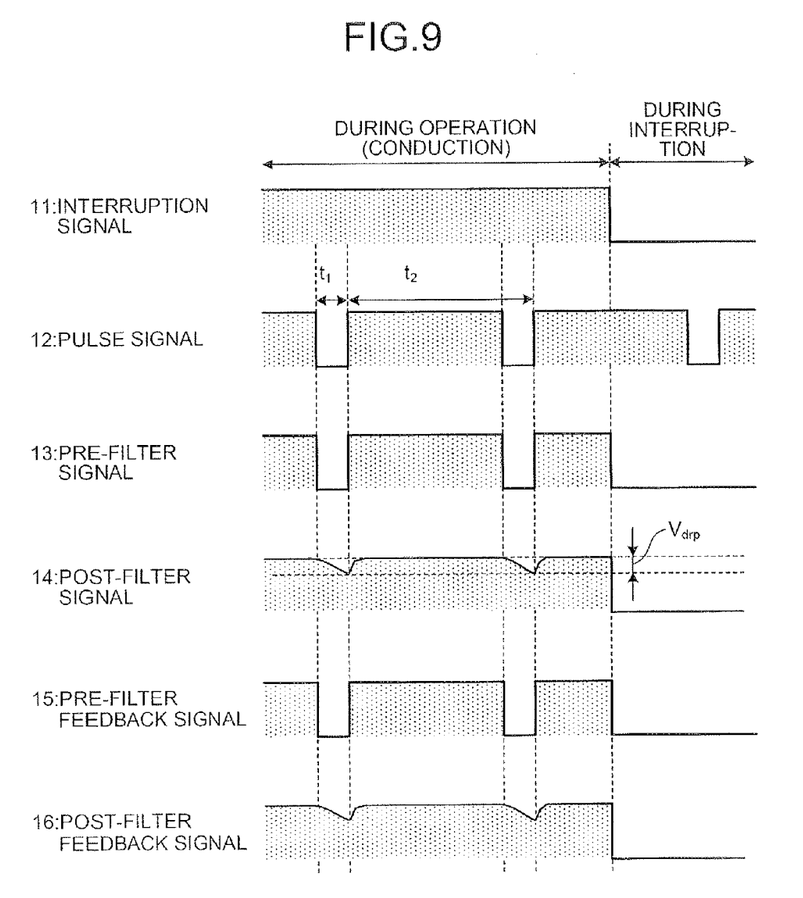
FIG. 9 is a timing chart for explaining operations of signals in the circuit fault detection device and the motor drive device according to the second embodiment of the present invention.

FIG. 8 is a configuration diagram of a circuit fault detection device and a motor drive device according to a second embodiment of the present invention. In a similar manner to the first embodiment, the circuit fault detection device includes the computing device 1 and the filter circuit 2. The motor drive device is the load 3. A form in which the filter circuit 2 is included in the load 3 can be alternatively used, that is, the filter circuit 2 can be a part of the motor drive device. FIG. 9 is a timing chart of operations of signals in the circuit fault detection device and the motor drive device according to the present embodiment. The computing device 1 includes the interruption-signal generation unit 21, the pulse generation unit 22, the monitoring unit 23, and the signal synthesis unit 24. The load 3 (the motor drive device) includes the control device 31, the bridge circuit 32, and the motor 33. The second embodiment is different from the first embodiment in that the pre-filter signal 13 output from the signal synthesis unit 24 is input to the monitoring unit 23 as a pre-filter feedback signal 15.

That is, the monitoring unit 23 according to the present embodiment is different from that in the first embodiment in observing the pre-filter feedback signal 15 that is the output signal of the signal synthesis unit 24. The monitoring unit 23 can use either a monitoring method A or a monitoring method B, which are explained below, as a method of observing the pre-filter feedback signal 15.

Figure 10:
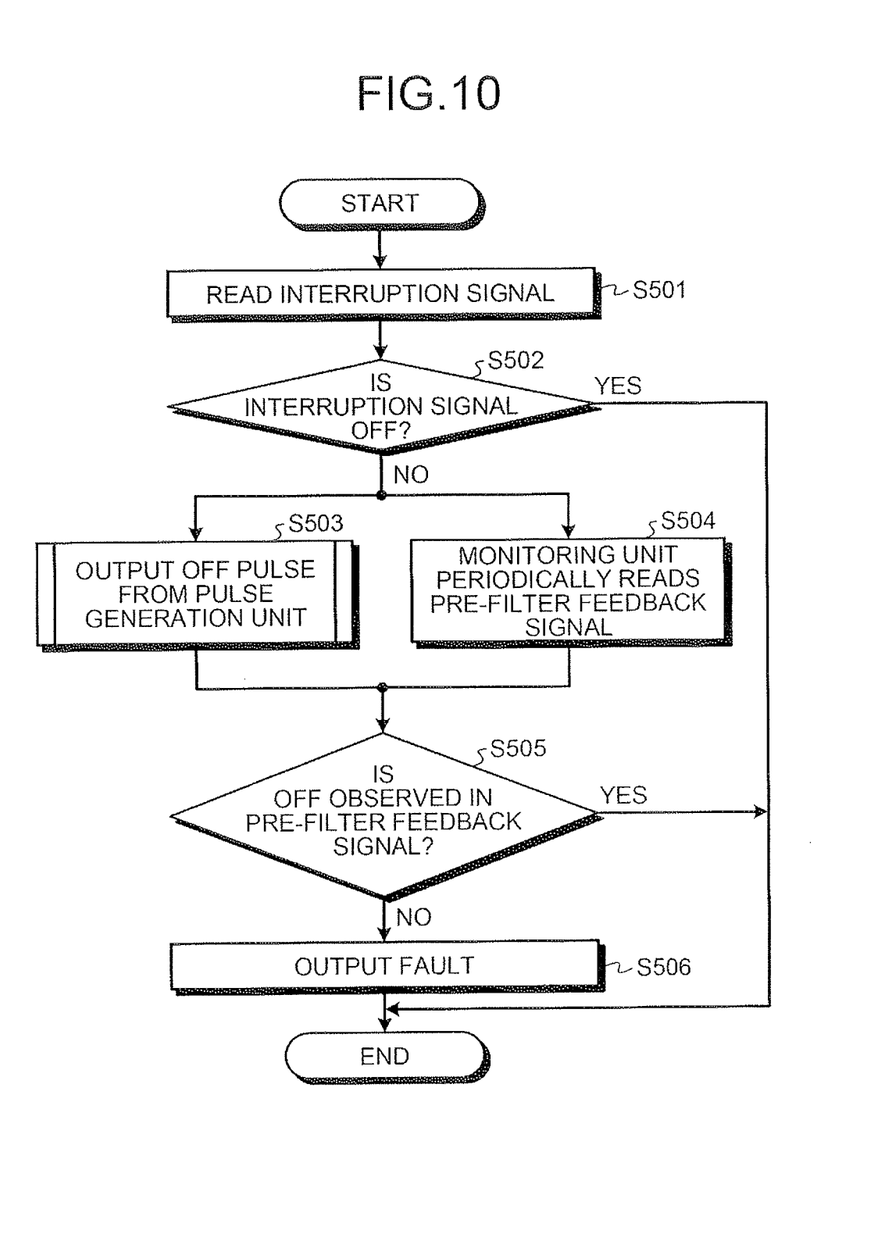
FIG. 10 is a flowchart for explaining an operation of a monitoring method A according to the second embodiment of the present invention.

The monitoring method A is a method of monitoring the pre-filter feedback signal 15 by connecting the signal to a general-purpose input port of the microcomputer. With this method, whether the pre-filter feedback signal 15 is ON or OFF can be read at a processing timing of the microcomputer. FIG. 10 is a flowchart of processing by the monitoring method A. The computing device 1 performs the processing shown in the flowchart of FIG. 10 at a constant period. First, the computing device 1 reads the interruption signal 11 (Step S501). When the interruption signal 11 is OFF (YES at Step S502), the processing ends. When the interruption signal 11 is ON (NO at Step S502), an OFF pulse is output from the pulse generation unit 22 (Step S503), and the monitoring unit 23 periodically reads the pre-filter feedback signal 15 (Step S504) and records therein the value. A method of outputting the OFF pulse from the pulse generation unit 22 (Step S503) is identical to that in the first embodiment and any one of the pulse output methods A, B, and C or other methods can be used.

After outputting of the OFF pulse from the pulse generation unit 22 (Step S503) is completed, the monitoring unit 23 determines the value of the read pre-filter feedback signal 15. When OFF is observed (YES at Step S505), the operation is normal and thus the computing device 1 completes the processing without performing any process. When OFF is not observed (NO at Step S505), the computing device 1 determines that a circuit fault has occurred and outputs a fault (Step S506).

Figure 11:
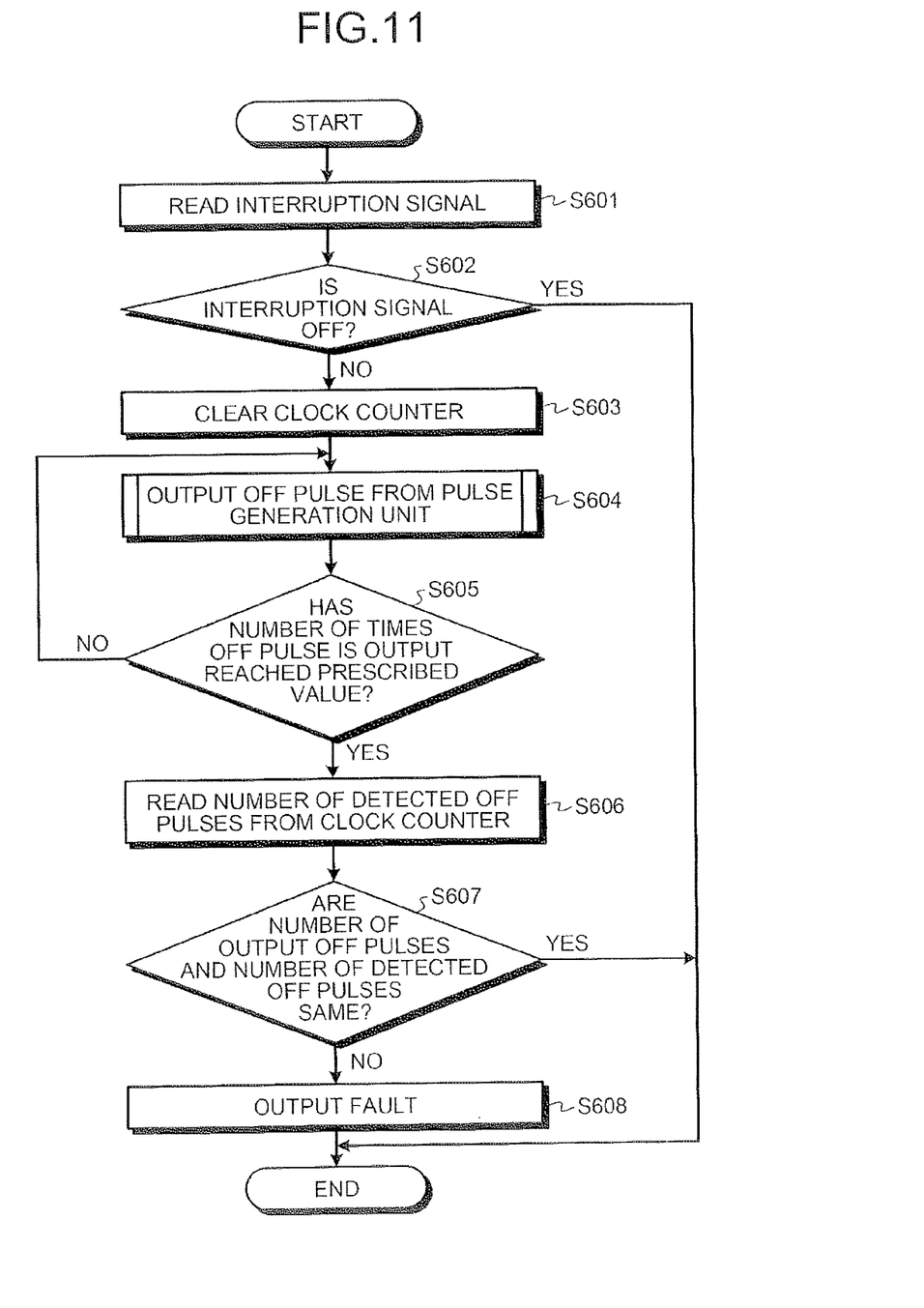
FIG. 11 is a flowchart for explaining an operation of a monitoring method B according to the second embodiment of the present invention.

The monitoring method B is a method of monitoring the pre-filter feedback signal 15 by connecting the signal to a clock counter of the microcomputer. The clock counter is included, for example, in the monitoring unit 23. With this method, the number of OFF pulses in a certain time can be counted by counting falling edges or rising edges of the pre-filter feedback signal 15. FIG. 11 is a flowchart of processing by the monitoring method B. The computing device 1 performs processing shown in the flowchart of FIG. 11 at a constant period.

First, the computing device 1 reads the interruption signal 11 (Step S601). When the interruption signal 11 is OFF (YES at Step S602), the processing ends. When the interruption signal 11 is ON (NO at Step S602), the clock counter is cleared (Step S603). An OFF pulse is then output from the pulse generation unit 22 (Step S604). A method of outputting the OFF pulse from the pulse generation unit 22 (Step S604) is identical to that in the first embodiment and any one of the pulse output methods A, B, and C or other methods can be used. At the same time, the number of times the OFF pulse is output is counted and whether the number has reached a prescribed value is determined (Step S605). When the number has not reached the prescribed value (NO at Step S605), the OFF pulse is output again from the pulse generation unit 22 (Step S604).

When the number of times the OFF pulse is output has reached the prescribed value at Step S605 (YES at Step S605), the monitoring unit 23 reads the number of detected OFF pulses from the clock counter (Step S606). When the number of detected OFF pulses and the number of output OFF pulses match (YES at Step S607), the operation is normal and thus the computing device 1 completes the processing without performing any process. When the numbers do not match (NO at Step S607), the computing device 1 determines that a circuit fault has occurred and outputs a fault (Step S608).

When the monitoring method A is used, the computing device 1 needs to perform the processing of reading the pre-filter feedback signal 15 (Step S504) more than plural times with respect to one OFF pulse output. In contrast thereto, when the monitoring method B is used, one monitoring process (Step S607) suffices for the prescribed number of OFF pulse outputs (Steps S604 and S605) and thus computing resources of the computing device 1 can be suppressed. Conversely, more OFF pulses can be processed with the same computing resources and thus more frequent circuit diagnoses can be performed. That is, the time from the occurrence of a fault in a circuit to the detection of the occurrence of the fault can be shortened.

As explained above, the circuit fault detection device according to the above embodiments includes the interruption-signal generation unit that outputs an interruption signal, the pulse generation unit that outputs a test pulse, the signal synthesis unit that superimposes the interruption signal and the test pulse together, the filter circuit that delays an output signal from the signal synthesis unit, an electrical device that becomes conductive or is interrupted by an output signal from the filter circuit, and the monitoring unit that monitors feedback of the output signal from the filter circuit. The monitoring unit diagnoses a change of the feedback signal due to a test pulse. The pulse generation unit can dynamically change a pulse OFF time of the test pulse.

That is, in the circuit fault detection device according to the above embodiments, the filter circuit configured from an RC filter or the like is provided in order to avoid power supply interruption with a test pulse. The test pulse is delayed by the filter circuit and is input to the electrical device such as a motor control circuit. The signal input to the electrical device is fed back and observed, thereby enabling a diagnosis in a wider range including also the filter circuit. The OFF time of the test pulse is automatically changed with variation of a load connected ahead of a power interruption signal.

Accordingly, the absence of a fault in a power interruption circuit can be diagnosed in a wider range and with a higher frequency without stopping the electrical device. Furthermore, the diagnosis can be achieved also in a case where a load connected to the power interruption circuit varies or is unknown.

Furthermore, the invention of the present application is not limited to the above embodiments and can be variously modified at the execution stage without departing from the scope thereof. Moreover, the above-described embodiments include inventions in various stages and various inventions can be extracted by appropriately combining a plurality of disclosed components. For example, even if some constituent elements are omitted from all the constituent elements described in the embodiments, as far as the problems mentioned in the section of Technical Problem can be solved and the effects mentioned in the section of Advantageous Effects of Invention can be obtained, the configuration from which some constituent elements have been omitted can be extracted as an invention. In addition, constituent elements mentioned in different embodiments can be appropriately combined.

INDUSTRIAL APPLICABILITY

As described above, the circuit fault detection device according to the present invention is useful in detecting a fault in a circuit that transmits a power-supply interruption signal, and is particularly suitable for detecting a fault in a motor drive circuit such as a bridge circuit that drives a motor.

REFERENCE SIGNS LIST 1 computing device, 2 filter circuit, 3 load, 11 interruption signal, 12 pulse signal, 13 pre-filter signal, 14 post-filter signal, 15 pre-filter feedback signal, 16 post-filter feedback signal, 21 interruption-signal generation unit, 22 pulse generation unit, 23 monitoring unit, 24 signal synthesis unit, 31 control device, 32 bridge circuit, 33 motor.

The invention claimed is:

1. A circuit fault detection device comprising:
an interruption-signal generation unit that outputs an interruption signal for a drive circuit stopping driving of a drive target on a basis of the interruption signal;
a pulse generation unit that includes an adjustment unit adjusting a time during which a pulse signal is in an OFF state on a basis of a PWM signal input to the drive circuit and that generates the pulse signal;
a signal synthesis unit that outputs a logical AND of the interruption signal and the pulse signal;
a low-pass filter circuit that inputs, as an output, a signal obtained by delaying an output signal of the signal synthesis unit to the drive circuit; and
a monitoring unit that determines whether a circuit fault has occurred on a basis of whether a decline in an output voltage of the low-pass filter circuit is observed after a pulse signal in an OFF state is output from the pulse generation unit.

2. A circuit fault detection device comprising:
an interruption-signal generation unit that outputs an interruption signal for a drive circuit stopping driving of a drive target on a basis of the interruption signal;
a pulse generation unit that includes an adjustment unit adjusting a time during which a pulse signal is in an OFF state on a basis of a PWM signal input to the drive circuit and that generates the pulse signal;
a signal synthesis unit that outputs a logical AND of the interruption signal and the pulse signal;
a low-pass filter circuit that inputs, as an output, a signal obtained by delaying an output signal of the signal synthesis unit to the drive circuit; and
a monitoring unit that receives the output signal of the signal synthesis unit after a pulse signal in an OFF state is output from the pulse generation unit and determines whether a circuit fault has occurred on a basis of whether OFF is observed in the output signal.

3. The circuit fault detection device according to claim 2, wherein the monitoring unit includes a counter that counts a falling edge or a rising edge of a pulse of the output signal of the signal synthesis unit and determines whether a circuit fault has occurred on a basis of a value of the counter.

4. A circuit fault detection device comprising:
an interruption-signal generation unit that outputs an interruption signal for a drive circuit stopping driving of a drive target on a basis of the interruption signal;
a pulse generation unit that includes an adjustment unit adjusting a time during which a pulse signal is in an OFF state and that generates the pulse signal;
a signal synthesis unit that outputs a logical AND of the interruption signal and the pulse signal;
a low-pass filter circuit that inputs, as an output, a signal obtained by delaying an output signal of the signal synthesis unit to the drive circuit; and
a monitoring unit that determines whether a circuit fault has occurred on a basis of whether a decline in an output voltage of the low-pass filter circuit is observed after a pulse signal in an OFF state is output from the pulse generation unit, wherein
the adjusting unit adjusts a time during which the pulse signal is in an OFF state on a basis of an output voltage of the filter circuit.

5. A circuit fault detection device comprising:
- an interruption-signal generation unit that outputs an interruption signal for a drive circuit stopping driving of a drive target on a basis of the interruption signal;
- a pulse generation unit that includes an adjustment unit adjusting a time during which a pulse signal is in an OFF state and that generates the pulse signal;
- a signal synthesis unit that outputs a logical AND of the interruption signal and the pulse signal;
- a low-pass filter circuit that inputs, as an output, a signal obtained by delaying an output signal of the signal synthesis unit to the drive circuit; and
- a monitoring unit that receives the output signal of the signal synthesis unit after a pulse signal in an OFF state is output from the pulse generation unit and determines whether a circuit fault has occurred on a basis of whether OFF is observed in the output signal, wherein
- the adjusting unit adjusts a time during which the pulse signal is in an OFF state on a basis of an output voltage of the filter circuit.

6. The circuit fault detection device according to claim 5, wherein the monitoring unit includes a counter that counts a falling edge or a rising edge of a pulse of the output signal of the signal synthesis unit and determines whether a circuit fault has occurred on a basis of a value of the counter.

* * * * *